(12) United States Patent
Maryfield et al.

(10) Patent No.: US 8,558,337 B2
(45) Date of Patent: Oct. 15, 2013

(54) WIDE FIELD OF VIEW OPTICAL RECEIVER

(75) Inventors: Tony Maryfield, Poway, CA (US);
Richard Trissel, Gualala, CA (US);
Michael Roes, San Diego, CA (US)

(73) Assignee: Cubic Corporation, San Diego, CA (US)

( * ) Notice: Subject to any disclaimer, the term of this patent is extended or adjusted under 35 U.S.C. 154(b) by 0 days.

(21) Appl. No.: 13/240,530

(22) Filed: Sep. 22, 2011

(65) Prior Publication Data

US 2012/0241891 A1  Sep. 27, 2012

Related U.S. Application Data

(60) Provisional application No. 61/385,513, filed on Sep. 22, 2010.

(51) Int. Cl.
*H01L 31/0232* (2006.01)

(52) U.S. Cl.
USPC ............... 257/432; 257/E31.127; 438/69

(58) Field of Classification Search
USPC ............... 257/432, E31.127; 438/69
See application file for complete search history.

(56) References Cited

U.S. PATENT DOCUMENTS

| 7,491,923 | B2* | 2/2009 | Tani | 250/208.1 |
| 7,755,090 | B2* | 7/2010 | Abe et al. | 257/69 |
| 2005/0045981 | A1* | 3/2005 | Wang et al. | 257/432 |
| 2009/0085135 | A1* | 4/2009 | Bang | 257/432 |
| 2009/0283807 | A1* | 11/2009 | Adkisson et al. | 257/292 |
| 2011/0079801 | A1* | 4/2011 | Zhang et al. | 257/98 |
| 2012/0075509 | A1* | 3/2012 | Ito et al. | 348/265 |

* cited by examiner

*Primary Examiner* — Zandra Smith
*Assistant Examiner* — Paul Patton
(74) *Attorney, Agent, or Firm* — Kilpatrick Townsend & Stockton LLP (57) ABSTRACT

Techniques are disclosed for creating optical systems and assemblies that provide increased field of view (FOV) for light detection by coupling a flip-chip light sensor directly to a condenser lens. According to certain embodiments of the invention, an optical assembly can include a condenser lens with a substantially flat surface optically contacted with a substantially flat surface of a substrate of a flip-chip light sensor. The thickness of the substrate is such that the active area of the light sensor is disposed on a focal plane of the optical system. This enables accurate light detection and increased FOV over conventional techniques.

19 Claims, 6 Drawing Sheets

WIDE FIELD OF VIEW OPTICAL RECEIVER

CROSS-REFERENCES TO RELATED APPLICATIONS

The present application claims benefit under 35 USC 119 (e) of U.S. Provisional Application No. 61/385,513, filed on Sep. 22, 2011 of which the entire disclosure is incorporated herein by reference for all purposes.

BACKGROUND

Light detection in optical devices can take on various forms, according to the form and function of the optical device, among other concerns. For example, an optical communication system can include a weapon-mounted telescope with an optical assembly that directs at least a portion of the light entering an objective lens of the weapon-mounted telescope onto a light sensor, such as a photodiode. However, it can be difficult to maintain a high field of view for the light sensor, given the large aperture size and magnification of the telescope and relatively small size of the light sensor.

BRIEF SUMMARY

Techniques are disclosed for creating optical systems and assemblies that provide increased field of view (FOV) for light detection by coupling a flip-chip light sensor directly to a condenser lens. According to certain embodiments of the invention, an optical assembly can include a condenser lens with a substantially flat surface optically contacted with a substantially flat surface of a substrate of a flip-chip light sensor. The thickness of the substrate is such that the active area of the light sensor is disposed on a focal plane of the optical system. This enables accurate light detection and increased FOV over conventional techniques.

An example optical assembly according to the disclosure can include an optical lens having a substantially flat surface, and a photodiode having an active area configured to sense light, and a substrate. The substrate can have a first surface coupled to the active area, and a second surface, opposite the first surface, that is substantially flat. The substantially flat surface of the optical lens can be optically contacted with the second surface of the photodiode.

The example optical assembly also can include one or more of the following features. The optical lens can comprise silicon (Si). The active area can comprise indium gallium arsenide (InGaAs). The substrate comprises indium phosphide (InP). The photodiode can comprise an avalanche photodiode (APD). The photodiode can comprise a PIN photodiode. The active area of the photodiode can be configured to sense light having a wavelength of 1550 nm.

An example optical device according to the disclosure can include an objective lens and a condenser lens having a substantially flat surface. The condenser lens can be configured to focus at least a portion of light that enters the optical device through the objective lens. The optical device further can include a photodiode having a substrate with a first surface that is substantially flat and optically contacted with the substantially flat surface of the condenser lens, and a second surface disposed opposite the first surface. The substrate can be configured to pass at least a portion of the light focused by the condenser lens from the first surface to the second surface. The photodiode further can include an active area coupled to the second surface of the substrate and configured to sense at least a portion of light that passes through the second surface.

The example optical device further can include one or more of the following features. An optical band-pass filter configured to block at least a portion of the light that enters the optical device through the objective lens from passing through the condenser lens. The optical band-pass filter can be configured to pass at least a portion of light having a wavelength of 1550 nm. A width of a dimension of the active area coupled to the second surface of the substrate can be 200 microns or less. A distance from the first surface of the substrate to the second surface of the substrate can be between 200 microns and 400 microns. The photodiode can comprise an avalanche photodiode (APD). The photodiode can comprise a PIN photodiode.

An example method of manufacturing an optical assembly according to the disclosure can include providing an optical lens having a substantially flat surface, providing a photodiode having an active area coupled to a first surface of a substrate, and optically contacting a substantially flat second surface of the substrate of the photodiode to the substantially flat surface of the optical lens such that at least a portion of light focused by the optical lens is able to travel through the substantially flat second surface of the substrate to the active area coupled to the first surface of the substrate.

The example method of manufacturing an optical assembly further can include one or more of the following features. Polishing an unpolished surface of the substrate to provide the substantially flat second surface of the substrate. Forming the active area, in part, by forming a layer of indium gallium arsenide (InGaAs) coupled with the first surface of the substrate. Placing the substantially flat second surface of the substrate in intimate contact with the substantially flat surface of the optical lens in a vacuum. The photodiode can comprise an avalanche photodiode (APD). The photodiode can comprise a PIN photodiode.

Numerous benefits are achieved by way of the present invention over conventional techniques. For example, embodiments of the present invention enable enhanced FOV for optical receivers utilizing light sensors with the same size active area. This can allow for a smaller, cheaper, and/or lighter optical device. Additionally, because the FOV is increased, reduce or eliminate the need for the optical receiver to scan, which can reduce or eliminate the extra power needs required by scanning components. These and other embodiments of the invention, along with many of its advantages and features, are described in more detail in conjunction with the text below and attached figures.

BRIEF DESCRIPTION OF THE DRAWINGS

For a more complete understanding of this invention, reference is now made to the following detailed description of the embodiments as illustrated in the accompanying drawing, in which like reference designations represent like features throughout the several views and wherein.

In the appended figures, similar components and/or features may have the same reference label. Further, various components of the same type may be distinguished by following the reference label by a dash and a second label that distinguishes among the similar components. If only the first reference label is used in the specification, the description is applicable to any or all of the similar components having the same first reference label irrespective of the second reference label.

DETAILED DESCRIPTION

The ensuing description provides preferred exemplary embodiment(s) only, and is not intended to limit the scope, applicability or configuration of the disclosure. Rather, the ensuing description of the preferred exemplary embodiment(s) will provide those skilled in the art with an enabling description for implementing a preferred exemplary embodiment. It is understood that various changes may be made in the function and arrangement of elements without departing from the spirit and scope as set forth in the appended claims.

Light detection is a key component of optical communication system. Laser range finding, target acquisition, combat identification, laser tracking, space-to-ground communication, and other applications require light detection to capture and process light signals from a remote light source, such as a pulsed laser. This light detection is typically performed by a light sensor in an optical system of an optical device, which allows light to be directed toward and focused on the light sensor. The design of such an optical system is not trivial; several issues arise that can impact the performance of the of light detection by the light sensor.

A primary concern is the balance of three factors that weigh against a wide field of view (FOV). First, it can be desirable for an optical system to have a large aperture size, thereby maximizing the amount of gathered light. Second, light sensors are relatively small in size. For example, high performance detectors are typically limited in size to an active area of approximately 200 microns in diameter. Third, it is often desirable for an optical system to provide a high magnification. Each of these factors cause difficulties in designing an optical system with a wide FOV.

A wide FOV can be desirable in various applications. In long-range optical communications, for example, an optical system may have a high magnification in order to reduce background noise and, in optical systems that enable a user to see a target at which the optical system is directed, facilitate visibly locating the target. If, however, the optical system has a small FOV, it can be difficult to keep a target within the FOV of the optical system. Although some techniques can be employed to overcome this problem with small-FOV optical systems, such as using arrays of light sensors and/or motion-mounted (e.g., gimbal-mounted) sensors that can scan target areas, these techniques often reduce the efficiency (and battery life) and increase the cost of optical devices in which these small-FOV optical systems are deployed.

Embodiments of the present invention enable increased FOV over conventional optical systems by providing a flip-chip photodiode (or other light sensor) mounted onto a condenser lens. Unlike conventional methods, which often use techniques in which there is a gap between a condenser lens and light sensor, these embodiments utilize techniques in which there is no gap. By keeping the light in materials with a relatively high refractive index, embodiments provided herein are able to provide a higher FOV than conventional designs. Some embodiments can provide for a FOV of approximately three times larger or more than the FOV of comparable optical systems in which the condenser lens and light sensor are typically separated by a gap. Thus, embodiments provided herein enable optical devices to maintain relatively large aperture size, small light sensor size, and high magnification while preserving a relatively wide FOV. It can be noted that wide FOV optical detector discussed herein can be used in fixed optical communications systems as well as systems where laser scanning of an area is performed. In a scanning system, doubling the FOV, for example, can quadruple the amount of area that can be scanned without moving the optical device.

Figure 1:
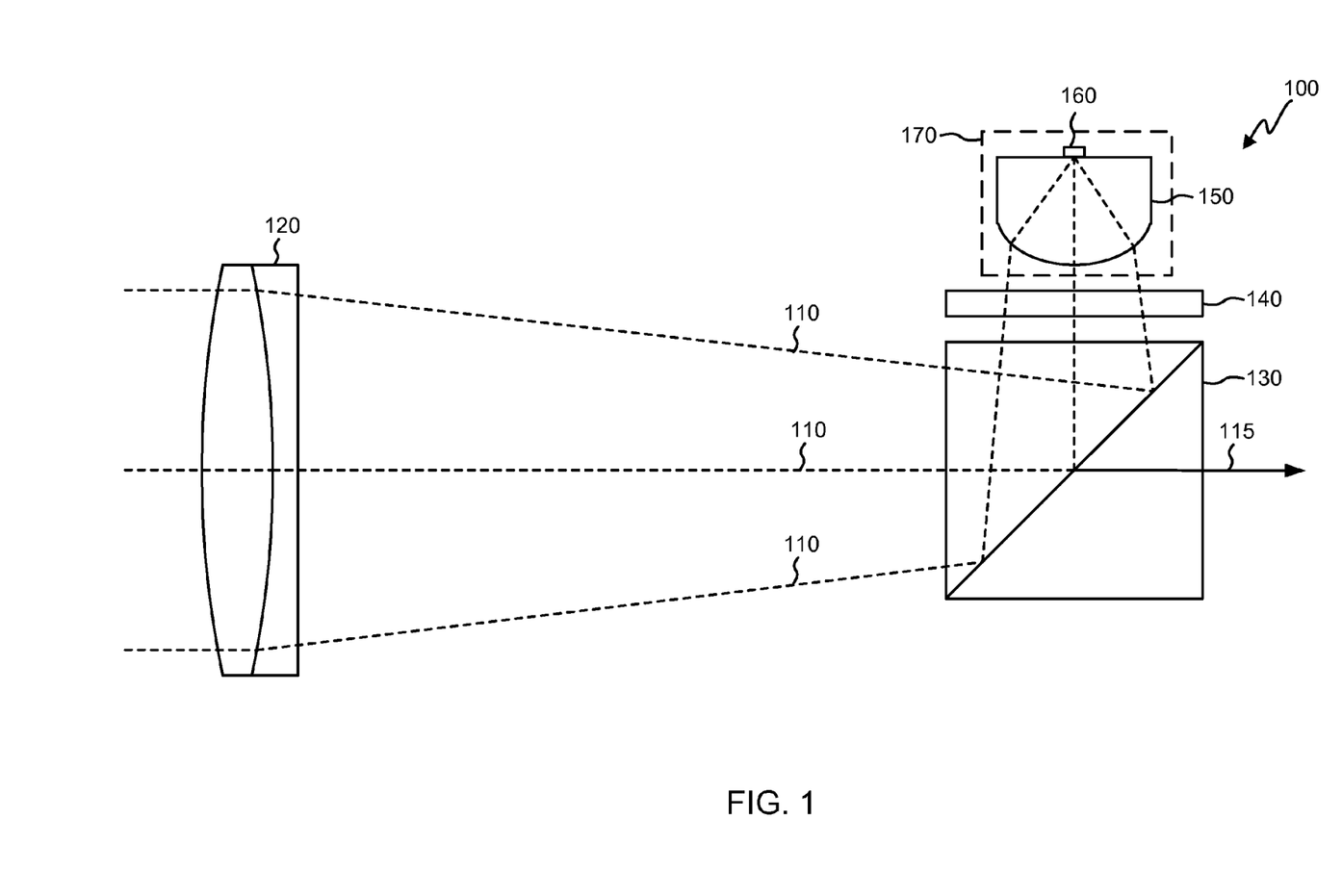
FIG. 1 is a simplified cross-sectional diagram of an optical system, according to an embodiment.

FIG. 1 is an image of a simplified cross-sectional diagram of an optical system 100, according to one embodiment of the present invention. Optical rays 110 can enter the optical system 100 through an objective lens 120. In various embodiments, the objective lens 120 can include a single lens, a compound lens, mirror, and/or a combination of several optical elements. Moreover, the objective lens 120 can have physical attributes, such as focal length, diameter, material composition, etc. to help provide the desired specifications of the optical system 100, such as a particular magnification and/or field of view. According to one embodiment, the objective lens has a clear aperture of 32 mm. Other embodiments can include larger or smaller apertures, depending on desired functionality. For example, embodiments can include aperture diameters of 25 mm or smaller, 35 mm, 38 mm, 50 mm, 63 mm, 80 mm, or 100 mm or larger.

After passing through the objective lens 120, optical rays 110 are guided toward an optical beam splitter 130. The optical beam splitter 130 is configured to divide the optical rays 110 such that a portion is guided toward an optical assembly with a light sensor 160, while the rest of the light 115 is guided toward other optical systems in an optical device. Other optical systems can include, for example, systems for visible and/or night-vision telescopic viewing. The optical beam splitter 130 can comprise any of a variety of types of optical beam splitters, such as prisms using a pair of prisms and/or a half-silvered mirror, depending on desired functionality. Because the light sensor 160 can be configured to detect a particular wavelength of light, the optical beam splitter also can be configured to split of a portion of the incoming optical rays 110 that include the spectrum detectable by the light sensor 160. Thus, the optical beam splitter 130 can include a dichroic mirrored prism or other optical assembly tuned to the spectrum detectable by the light sensor 160. Many military and communication applications utilize, for example, lasers and light sensors that emit and detect laser light with a wavelength of approximately 1550 nm. Thus, the optical beam splitter, in some embodiments, can be a dichroic mirrored prism configured to divert at least a portion of a spectrum of the incoming optical rays 110 having 1550 nm toward the light sensor 160. Other embodiments can include any of a variety of variations, modifications, and alternatives, depending on the desired functionality of the optical system 100. For example, some embodiments may include a standalone light-detection system in which there is no need to split incoming optical rays 110 between a light-detection optical assembly and other optical assemblies. Thus, some embodiments may omit the optical beam splitter 130.

Optionally, the optical system 100 also can include an optical band-pass filter 140 to filter the portion of the incoming optical rays 110 directed toward the light sensor 160 by the optical beam splitter 130. Such a filter can be used to help reduce noise current produced by the light sensor 160 as a result of background light. The optical band-pass filter 140 can be used in addition or as an alternative to any spectrum-specific filtering provided by the optical beam splitter 130. The width of the spectrum passed by the optical band-pass filter can vary, depending on the detectable spectrum of the light sensor 160, acceptable tolerances for light detection and noise, and other considerations. In some embodiments, the band-pass filter is 10 nm wide, centered on the desired wavelength (e.g., 1550 nm). In other embodiments, the band-pass filter can be 20 nm, 25 nm, 30 nm, 35 nm, 40 nm, or wider. Other embodiments can include band-pass filters as narrow as 5 nm or less.

Figure 2:
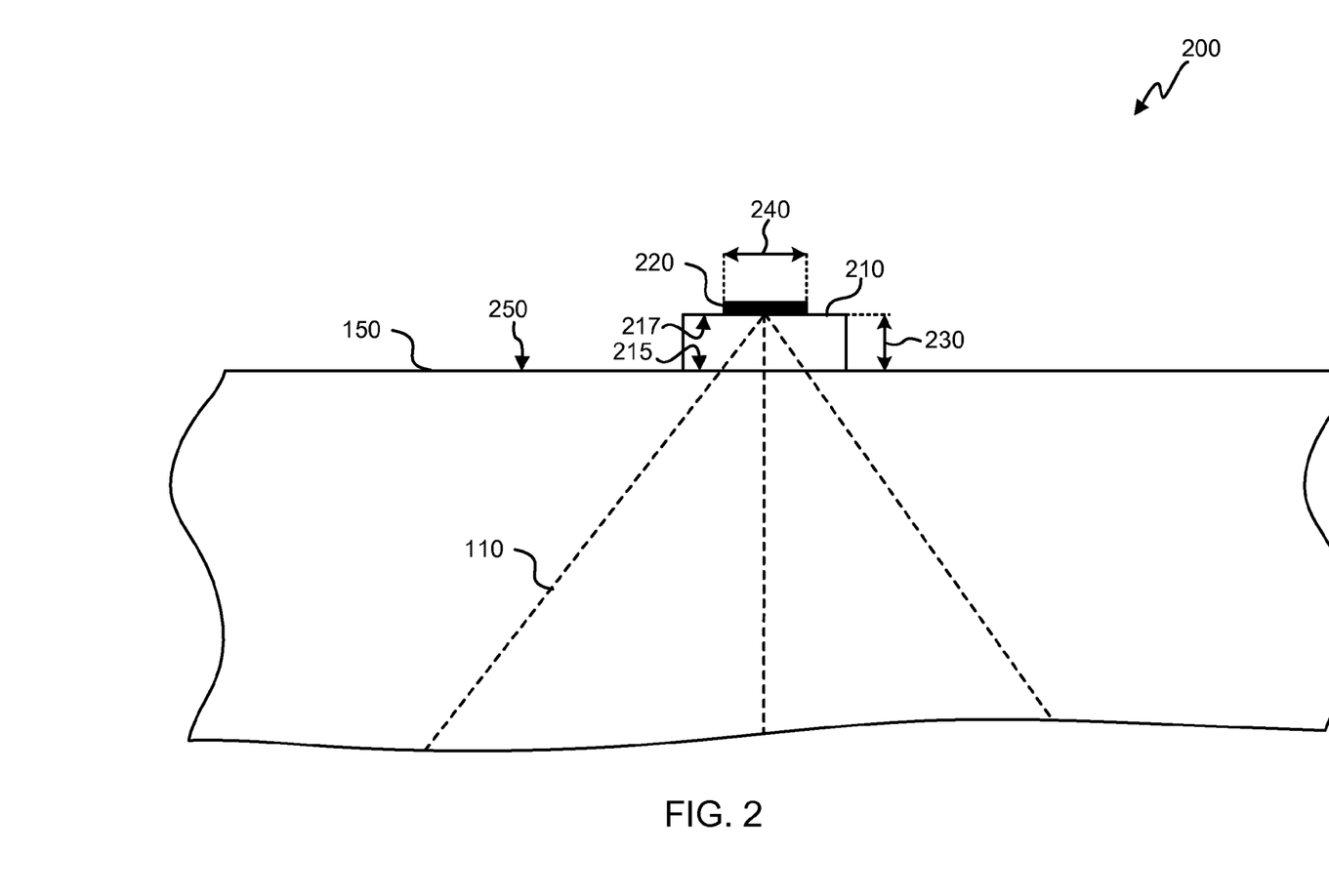
FIG. 2 is an illustration showing a simplified cross-sectional view of a portion of an optical assembly, according to an embodiment.

The optical system 100 additionally can include an optical assembly 170 comprising a condenser lens coupled to the light sensor 160. FIG. 2 is an illustration showing a simplified cross-sectional view of a portion 200 of the optical assembly 170. The portion 200 includes a portion of the condenser lens 150 coupled to the light sensor 160, which comprises a substrate 210 coupled to an active area 220 that detects incoming optical rays 110.

The condenser lens can be formed from a material with a relatively high index of refraction at the detectable wavelength, providing a very short focal length, as shown in FIG. 2. The very short focal length allows the active area 220 of the light sensor 160 to be disposed approximately (i.e., within tolerances acceptable to the optical system 100) at a focal plane of the optical system 100 to provide for accurate light detection. In some embodiments, the condenser lens is formed from silicon (Si), which has a particularly high index of refraction at wavelengths of 1550 nm. Si also can be advantageous because it is a stable material that is easier to handle and polish than other materials. Even so, other materials, such as optical glass and/or germanium (Ge), can be used.

The thickness of the condenser lens 150 can vary, depending on desired functionality. In one embodiment, for example, the thickness of the condenser lens is 10 mm. In other embodiments, the thickness can be 20 mm or higher. Other embodiments include a condenser lens 150 with a thickness of 2.5 mm or less. Such thicknesses can depend on numerous factors, including the index of refraction of the material from which the condenser lens 150 is formed.

The light sensor 160 can be a flip-chip integrated circuit in which the substrate 210 is coupled with the condenser lens 150 to create an immersion lens, ensuring the light is kept in a material with a high index of refraction (relative to air) until the light illuminates the active area 220 coupled to a first surface 217 of the substrate 210. As such, the substrate 210 not only should be transparent to at least the portion of the optical rays 110 focused by the condenser lens that is to be detected by the active area 220 of the light sensor 160, but the substrate should also frustrate total internal reflection (TIR) of the focused optical rays 110. More specifically, when the angle of the light rays 110 reaches a certain angle, they can reflect upon reaching the surface of the lens due to TIR if the index of refraction of the substrate 210 is much less than the index of refraction of the condenser lens 150. In embodiments using an Si condenser lens 150, an indium phosphide (InP) substrate can be used because it has an index of refraction similar to Si, both of which are transparent to light having a wavelength of 1550 nm. Moreover, embodiments utilizing a combination of a Si condenser lens 150 and a flip-chip light sensor 160 can have reduced noise current produced by indirect solar illumination. The use of a substrate 210 with a high index of refraction prevents TIR and allows the optical rays 110 to enter the substrate 210 at a second surface 215 of the substrate 210. From there, at least a portion of the optical rays 110 pass through the substrate 210 to illuminate the active area 220 coupled with the first surface 217 of the substrate 210 opposite the second surface 215.

The substrate 210 of the light sensor 160 can be optically contacted with the condenser lens 150 to help ensure TIR with the condenser lens 150 is frustrated. Optical contacting, also known as molecular bonding or optical contact bonding, is a glueless process in which two closely conformal surfaces are bonded by intermolecular forces. In certain embodiments, the condenser lens 150 can have a substantially flat surface 250 that is optically contacted to a corresponding substantially flat surface 215 of the substrate 210. "Substantially flat," as provided herein, means within acceptable tolerances for enabling optical contacting. The substantially flat surface 250 of the condenser lens 150 and/or the substantially flat surface 215 of the substrate 210 may be intrinsically flat from the manufacturing techniques used to form the condenser lens 150 and substrate 210, respectively, or can be flattened using any of a variety of known planarization techniques. These techniques can include chemical mechanical planarization (CMP), etching, abrasive polishing, and/or other methods. The process of optical contacting the substantially flat surfaces 250 and 215 can include placing the condenser lens 150 and light sensor 160 in a vacuum while bringing the substantially flat surfaces 215 and 250 into intimate contact. Alternatively, the substantially flat surfaces 250 and 215 may be optically contacted in an environment having air by "wringing" out the air between the substantially flat surfaces 250 and 215 with pressure and/or movement, if the alignment of the active area 220 is not compromised. Optical contact can be verified prior to final assembly. Additionally or alternatively, the substrate 210 and condenser lens 150 may be mechanically pressed together during operation.

Some embodiments contemplate coupling the substrate 210 with the condenser lens 150 using an epoxy in lieu of optical contacting. In such embodiments, an epoxy has a high index of refraction that frustrates TIR of the optical rays 110 focused by the condenser lens 150, and passes at least a portion of the light to be detected by the active area 220. Because epoxies typically do not have the high index of refraction that matches some solid materials (e.g., Si, InP, etc.), embodiments utilizing epoxies may not have a condenser lens 150 and/or substrate 210 with refractive indices as high as embodiments utilizing optical contacting.

The structure and composition of the active area 220 can vary, depending on manufacturing concerns, desired spectrum of light to be detected (e.g., 1550 nm), and other factors. According to some embodiments, for example, the active area 220 comprises a layer of indium gallium arsenide (InGaAs) with which an avalanche photodiode (APD) is formed. In other embodiments, the active area can include a PIN photodiode. Although an avalanche photodiode can provide a better signal-to-noise ratio (SNR), a PIN photodiode can be preferable an optical device incorporating the light sensor 160 used in bright environments, where targets are against bright backgrounds, or in other situations in which is capable of producing a large amount of background noise current. Yet other embodiments contemplate using an active area 220 having some combination of APD and PIN photodiodes. Furthermore, embodiments can include active areas 220 comprising one or more other materials, such as Ge, lead(II) sulfide, Si, and the like.

The width 240, or diameter, of the active area 220 (measured in a dimension along or coupled to the first surface 217)

can vary, depending on desired functionality. Although embodiments can include an active area 220 with a width of up to 1 mm or more, many embodiments contemplate an active area 220 of 200 microns or less. Some embodiments, for example, include a light sensor 160 with an active area 220 having a width 240 of 80 microns. The size of the active area 220 can dictate the SNR and FOV of the optical system 100. For example, larger active areas 220 can provide a larger FOV, but with a higher noise floor (i.e., lower SNR). On the other hand, smaller active areas 220 can increase SNR, but at the cost of reducing the FOV of the optical system 100. The chosen width 240 of the active area 220 can have impacts on other structural features of the optical system 100, such as the thickness 230 of the substrate 210.

The thickness 230 of the substrate can vary, depending on desired functionality. Such thickness can depend on manufacturing capabilities, such as the ability to provide optical-grade materials at various thicknesses and the focal length of the condenser lens 150. According to some embodiments, the thickness 230 of the substrate 210 can be between 200 microns and 400 microns. Other embodiments contemplate thicknesses above 400 microns or below 200 microns.

Figure 3:
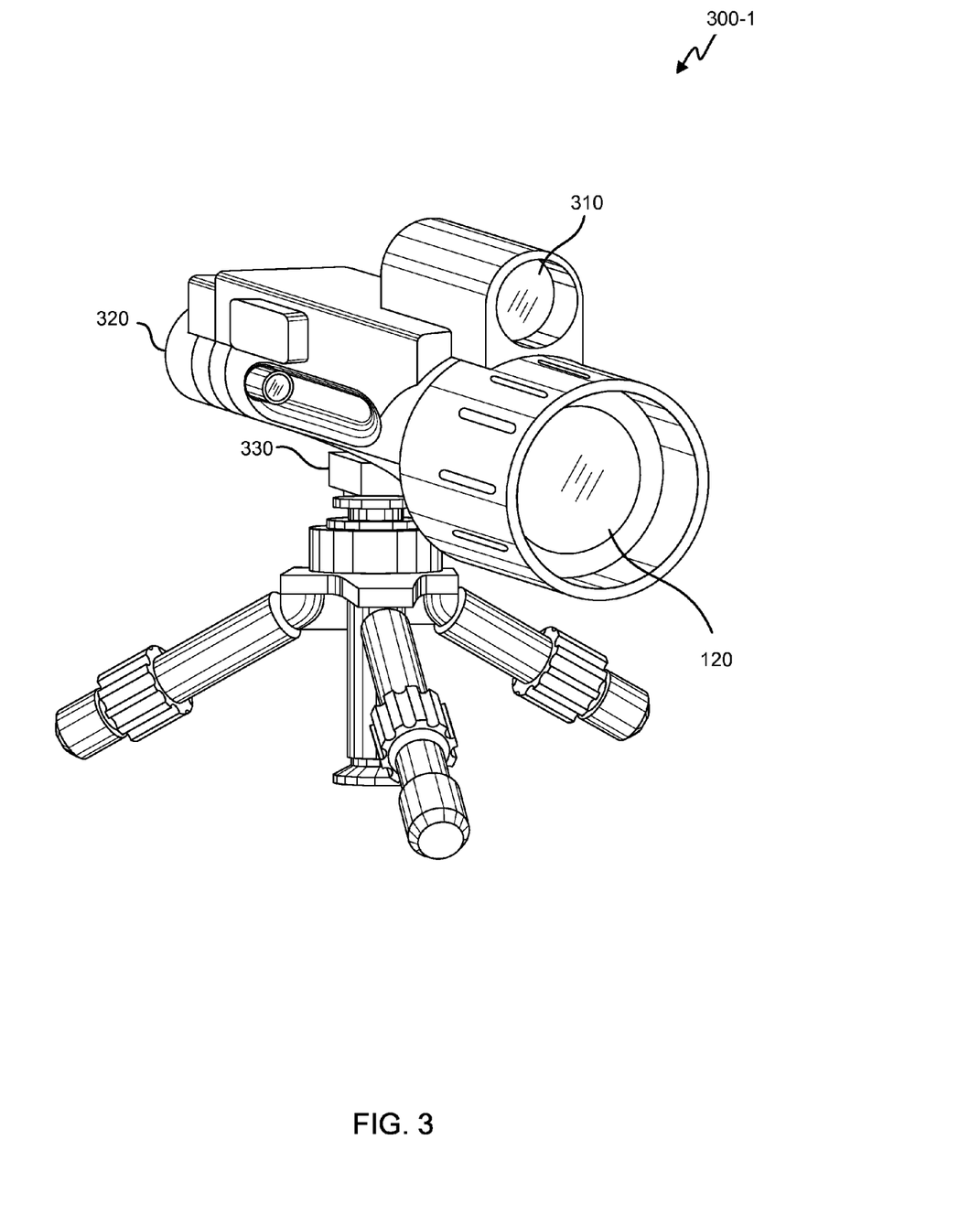
FIG. 3 is an illustration of embodiment of an optical device integrating the wide FOV optical receiver discussed herein.

FIG. 3 illustrates an embodiment of an optical device 300-1 integrating the wide FOV optical receiver discussed herein. In this embodiment, the optical device 300-1 includes a laser interrogator 310 that transmits laser signals in a direction at which the objective lens 120 is targeted. This allows for any reflected light from the laser signals to enter the objective lens 120 for detection by a light sensor 160. Optical communication systems can include, for example, modulating retroreflectors (not shown) configured to reflect and modulate the laser signals transmitted by the laser interrogator 310.

The optical device 300-1 utilizes the wide FOV optical receiving techniques described herein, and therefore can have a larger FOV than similar devices. According to some experiments, for example, an optical device utilizing the optical assembly 170 described herein was able to achieve an FOG of approximately 24 millirads (mrad), whereas a similar device (having an air gap between a light sensor and a condenser lens) was able to achieve an FOV of only 7 mrad. Other embodiments utilizing the optical assembly 170 were able to achieve an FOV of approximately 4 degrees.

The optical device 300-1 also can include a variety of other features. For example an eyepiece 320 can enable a user to view an image of a target at which the optical device 300-1 is directed. Furthermore, a mount 330 can enable the optical device to be mounted to a tripod, weapon, vehicle, or other object, depending on desired functionality. One having ordinary skill in the art will recognize that the optical device 300-1 is only one of a variety of optical devices that could integrate the features described herein.

Figure 4:
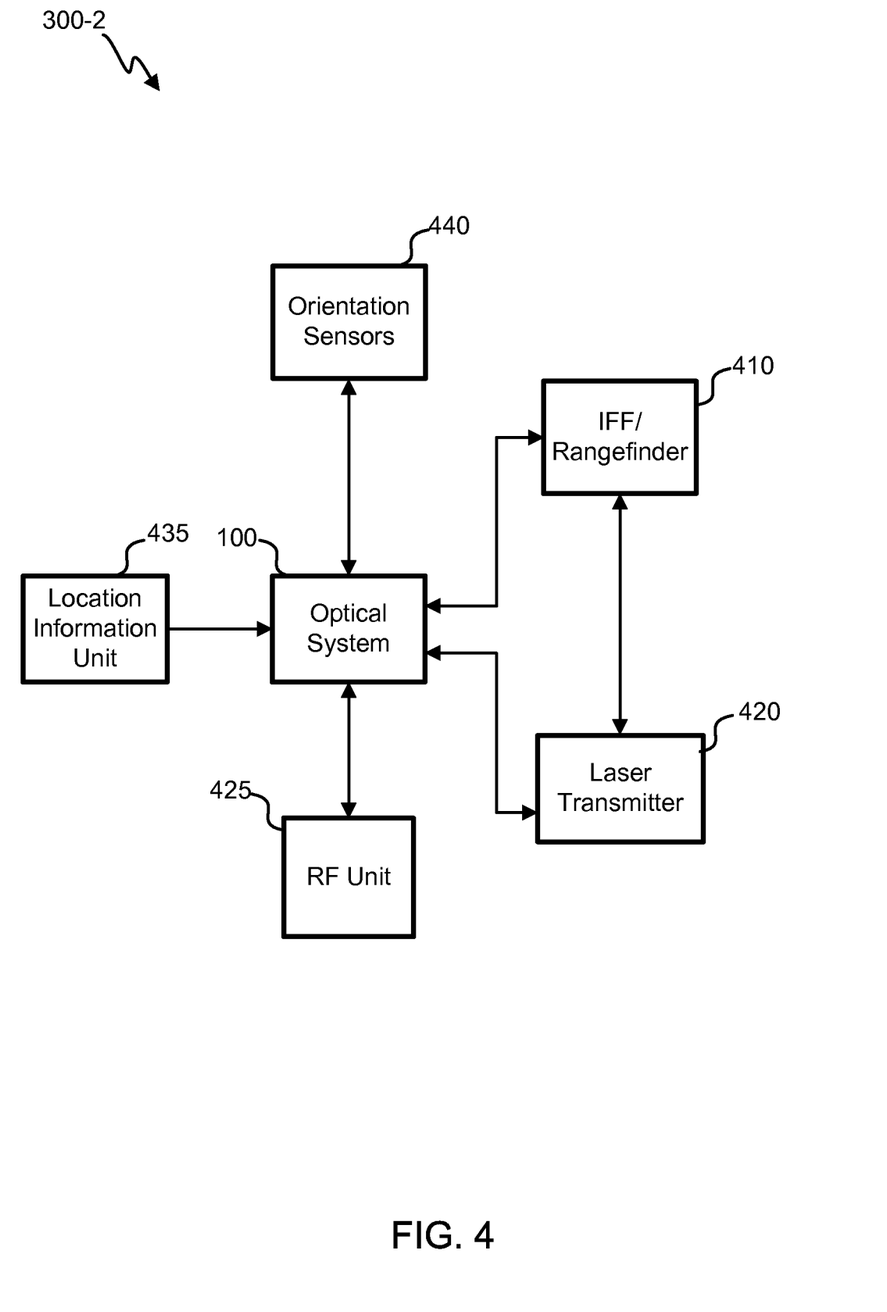
FIG. 4 is a block diagram of an optical device, according to another embodiment, illustrating various components with which an optical system and/or optical assembly detailed herein may be integrated.

FIG. 4 is a block diagram of an optical device 300-2, according to another embodiment, illustrating various components with which the optical system 100 and/or optical assembly 170 detailed herein may be integrated. This embodiment incorporates the optical system 100 with an Identification, Friend or Foe (IFF)/rangefinder unit 410. According to this embodiment, the IFF/rangefinder unit 410 can utilize a laser transmitter 420 and light-receiving capabilities of the optical system 100 for determination of a friend-or-foe status by communicating with a target. It also can determine a distance to the target. In some embodiments, the laser transmitter can use a laser that generates light having a wavelength of 1550 nanometers, but lasers generating other wavelengths, including 904 nm, also can be used. Additionally, a visible laser (e.g., red-spotting laser) can be integrated into the optical device 300-2, used for aiming a weapon to which the optical device 300-2 is mounted.

The present invention contemplates numerous ways of integrating the components shown in FIG. 4. One or more of the components can include hardware and/or software for communicating with other components and/or relaying information to a user, which can be provided in an embedded display on the optical device 300-2, or overlaid in an image viewable in the eyepiece of the optical device 300-2. With this understanding, one or more of the components shown in FIG. 4 may be physically and/or logically combined or separated without departing from the spirit of the disclosure provided herein.

The optical system 100 can be coupled with a radio frequency (RF) unit 425. The RF unit 425 can be a tactical radio communicatively coupled with a squad radio that can relay information to and from a central system, which can be provided to a user looking through the eyepiece of the optical device 300-2. In either case, the information communicated via the RF unit 425, the laser transmitter 420, and/or optical system 100 can include weapon, range, identification, and other information.

A location information unit 435 and orientation sensors 440 also can be coupled with the optical system 100 to provide location, altitude, and orientation information. The location information unit 435 can include Global Positioning System (GPS), Global Navigation Satellite System (GNSS), and/or other location systems. The orientation sensors 440 can include a magnetic compass, celestial compass, inclinometer, accelerometer, and/or other systems to sense the azimuth, elevation, heading, and other orientation information regarding the optical device 300-2. Other sensors and components also can be communicatively coupled to the optical system 100.

Figure 5A:
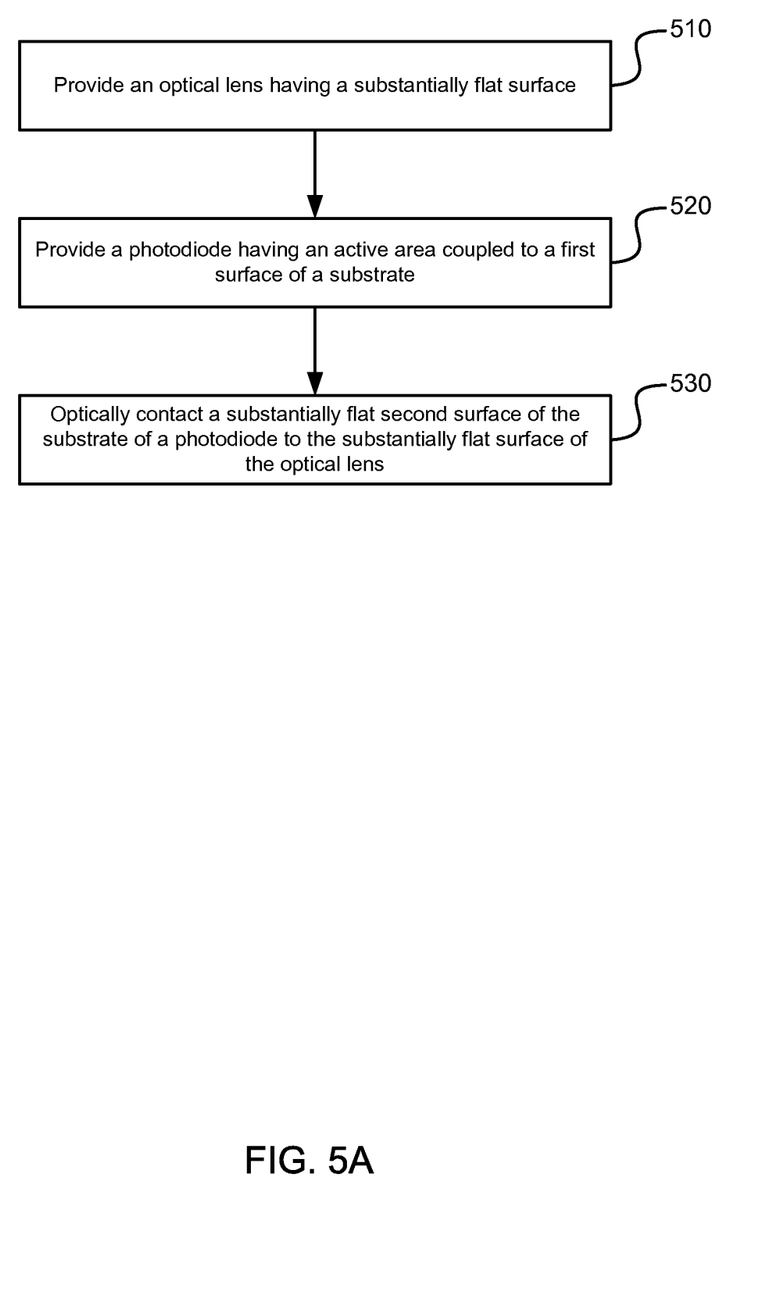
FIG. 5A is a flow diagram illustrating a simplified method for manufacturing an optical assembly, according to one embodiment.

FIG. 5A is a flow diagram illustrating a simplified method for manufacturing the optical assembly 170, according to one embodiment. The method can begin at block 510, where an optical lens having a substantially flat surface 250 is provided. At block 520, a photodiode (or other light sensor 160) having an active area 220 coupled to a first surface 217 of a substrate 210 is provided. At block 530, a substantially flat second surface 215 of the substrate 210 of a photodiode is optically contacted to the substantially flat surface 250 of the optical lens 150. As indicated previously, the substantially flat surfaces 215 and 250 do not need to be atomically flat, but can be sufficiently flat to enable optical contacting. Moreover, the optical contacting of block 530 can occur in a vacuum, or may occur in an atmosphere, in which case the air between the substantially flat surfaces 215 and 250 may be "wrung" out through pressure and/or movement.

It should be appreciated that the specific steps illustrated in FIG. 5A provide a particular method of manufacturing an optical assembly 170 according to an embodiment of the present invention. Other sequences of steps may also be performed according to alternative embodiments. For example, alternative embodiments of the present invention may perform the steps outlined above in a different order. Moreover, the individual steps illustrated in FIG. 5A may include multiple sub-steps that may be performed in various sequences as appropriate to the individual step. Furthermore, additional steps may be added or removed depending on the particular applications. One of ordinary skill in the art would recognize many variations, modifications, and alternatives.

Figure 5B:
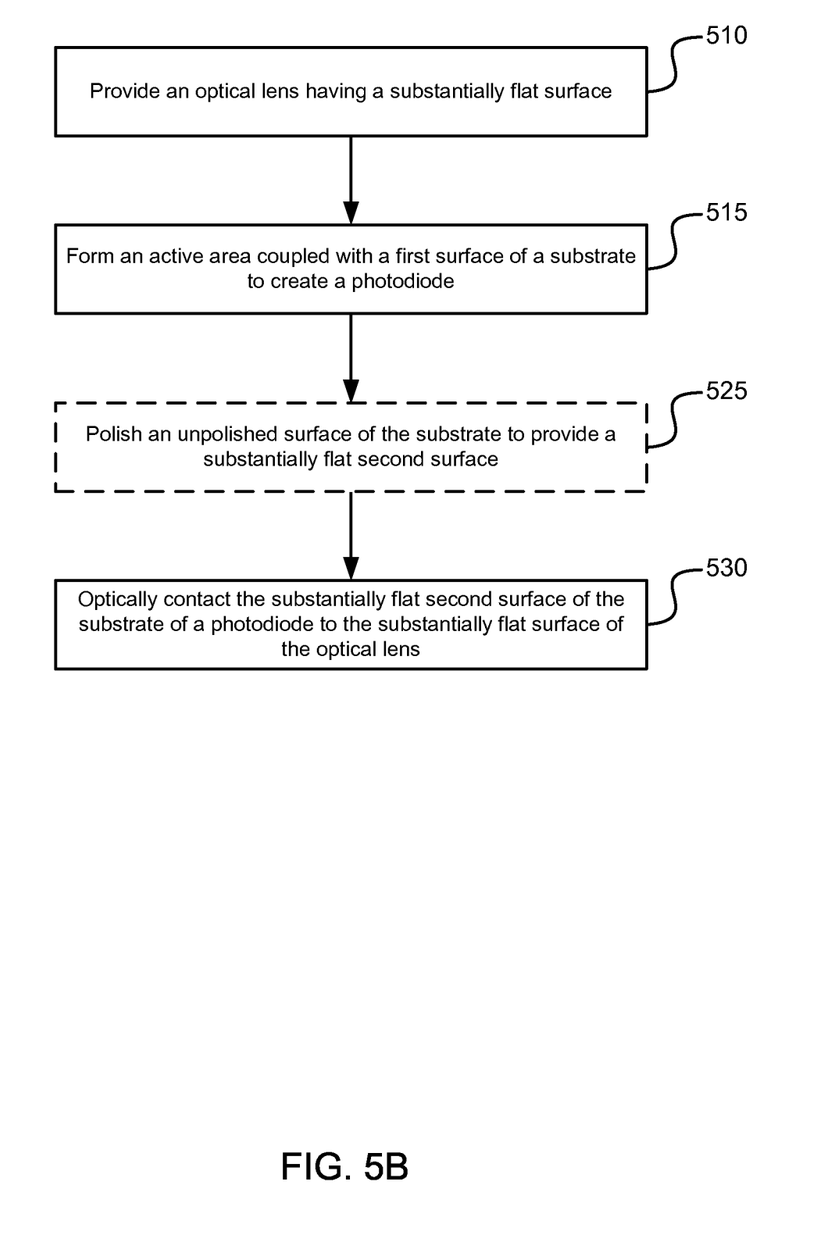
FIG. 5B is a flow diagram illustrating a simplified method for manufacturing an optical assembly, according to another embodiment.

FIG. 5B is a flow diagram illustrating a simplified method for manufacturing an the optical assembly 170, according to another embodiment. Similar to the method of FIG. 5A, the method of FIG. 5B can begin at block 510, where an optical lens having a substantially flat surface 250 is provided. Here a photodiode can be created, at block 515, by forming an active area coupled with a first surface 217 of a substrate 210. As discussed herein, the photodiode can comprise a PIN photodiode and/or APD, but other optical sensing structures are contemplated. Optionally, if an unpolished surface of the substrate to be contacted with the optical lens needs to be flattened to provide for optical contacting, then the unpolished surface of the substrate can be polished to provide a substantially flat second surface 215, at block 525. Polishing can include chemical and/or mechanical techniques, such as CMP, etching, abrasive polishing, and the like. Similar to the process of FIG. 5A, a substantially flat second surface 215 of the substrate 210 of a photodiode is optically contacted to the substantially flat surface 250 of the optical lens 150, at block 530.

It should be appreciated that the specific steps illustrated in FIG. 5B provide a particular method of manufacturing an optical assembly 170 according to an embodiment of the present invention. Other sequences of steps may also be performed according to alternative embodiments. For example, alternative embodiments of the present invention may perform the steps outlined above in a different order. Moreover, the individual steps illustrated in FIG. 5B may include multiple sub-steps that may be performed in various sequences as appropriate to the individual step. Furthermore, additional steps may be added or removed depending on the particular applications. One of ordinary skill in the art would recognize many variations, modifications, and alternatives.

Although embodiments described herein have a single light sensor 160, it will be appreciated that some embodiments could achieve even wider FOV for the optical system 100. For example, a number of wide FOV detectors could be ganged together in an array or matrix. The wide FOV detectors would cover different portions of a scene captured by the objective lens 120, and the results from the wide FOV detectors could be electronically stitched together. This embodiment could avoid steering the detector system because of its larger coverage. Other embodiments utilizing multiple light sensors 160 are contemplated.

Various components may be described herein as being "configured" to perform various operations. Those skilled in the art will recognize that, depending on implementation, such configuration can be accomplished through design, setup, placement, interconnection, and/or programming of the particular components and that, again depending on implementation, a configured component might or might not be reconfigurable for a different operation.

While the principles of the disclosure have been described above in connection with specific embodiments, it is to be clearly understood that this description is made only by way of example and not as limitation on the scope of the disclosure. Additional implementations and embodiments are contemplated. For example, the techniques described herein can be applied to various forms of optical devices, which may comprise a smaller portion of a larger optical system. Yet further implementations can fall under the spirit and scope of this disclosure.

What is claimed is:

1. An optical assembly comprising:
    an optical lens having a substantially flat surface; and
    a photodiode having:
        an active area configured to sense light, and
        a substrate having:
            a first surface coupled to the active area, and
            a second surface, opposite the first surface, that is substantially flat, and smaller than the substantially flat surface of the optical lens;
    wherein the substantially flat surface of the optical lens is optically contacted with the second surface of the substrate, such that light that illuminates the active area passes through at least a portion of the substrate.

2. The optical assembly of claim 1, wherein the optical lens comprises silicon (Si).

3. The optical assembly of claim 1, wherein the active area comprises indium gallium arsenide (InGaAs).

4. The optical assembly of claim 1, wherein the substrate comprises indium phosphide (InP).

5. The optical assembly of claim 1, wherein the photodiode comprises an avalanche photodiode (APD).

6. The optical assembly of claim 1, wherein the photodiode comprises a PIN photodiode.

7. The optical assembly of claim 1, wherein the active area of the photodiode is configured to sense light having a wavelength of 1550 nm.

8. An optical device comprising:
    an objective lens;
    a condenser lens having a substantially flat surface, wherein the condenser lens is configured to focus at least a portion of light that enters the optical device through the objective lens; and
    a photodiode having:
        a substrate with:
            a first surface, smaller than the substantially flat surface of the condenser lens, that is substantially flat and optically contacted with the substantially flat surface of the condenser lens, and
            a second surface disposed opposite the first surface, wherein the substrate is configured to pass at least a portion of the light focused by the condenser lens from the first surface to the second surface; and
        an active area coupled to the second surface of the substrate and configured to sense at least a portion of light that passes through the second surface and at least a portion of the substrate.

9. The optical device of claim 8, further comprising an optical band-pass filter configured to block at least a portion of the light that enters the optical device through the objective lens from passing through the condenser lens.

10. The optical device of claim 9, wherein the optical band-pass filter is configured to pass at least a portion of light having a wavelength of 1550 nm.

11. The optical device of claim 8, wherein a width of a dimension of the active area coupled to the second surface of the substrate is 200 microns or less.

12. The optical device of claim 8, wherein a distance from the first surface of the substrate to the second surface of the substrate is between 200 microns and 400 microns.

13. The optical device of claim 8, wherein the photodiode comprises an avalanche photodiode (APD).

14. The optical device of claim 8, wherein the photodiode comprises a PIN photodiode.

15. A method of manufacturing an optical assembly, the method comprising:
    providing an optical lens having a substantially flat surface;
    providing a photodiode having an active area coupled to a first surface of a substrate; and
    optically contacting a substantially flat second surface of the substrate of the photodiode to the substantially flat surface of the optical lens such that at least a portion of light focused by the optical lens is able to travel through the substantially flat second surface of the substrate and at least a portion of the substrate to the active area coupled to the first surface of the substrate;

wherein optically contacting comprises placing the substantially flat second surface of the substrate in intimate contact with the substantially flat surface of the optical lens in a vacuum.

16. The method of manufacturing an optical assembly of claim 15, further comprising polishing an unpolished surface of the substrate to provide the substantially flat second surface of the substrate.

17. The method of manufacturing an optical assembly of claim 15, further comprising forming the active area, in part, by forming a layer of indium gallium arsenide (InGaAs) coupled with the first surface of the substrate.

18. The method of manufacturing an optical assembly of claim 15, wherein the photodiode comprises an avalanche photodiode (APD).

19. The method of manufacturing an optical assembly of claim 15, wherein the photodiode comprises a PIN photodiode.

* * * * *